US010599183B2

(12) United States Patent
Magi et al.

(10) Patent No.: US 10,599,183 B2
(45) Date of Patent: Mar. 24, 2020

(54) MAGNETIC SHEARING SOLUTION ALLOWING INTEGRATED FOLDING AND SEAMLESS DESIGN FOR FOLDABLE/BENDABLE DISPLAY FORM FACTOR DEVICES

(71) Applicant: Intel Corporation, Santa Clara, CA (US)

(72) Inventors: Aleksander Magi, Aloha, OR (US); Jason M Brand, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 745 days.

(21) Appl. No.: 15/199,051

(22) Filed: Jun. 30, 2016

(65) Prior Publication Data

US 2018/0004251 A1   Jan. 4, 2018

(51) Int. Cl.
| H04M 1/00 | (2006.01) |
| G06F 1/16 | (2006.01) |
| G06F 1/20 | (2006.01) |
| H01L 51/52 | (2006.01) |
| H04M 1/02 | (2006.01) |

(52) U.S. Cl.
CPC .......... *G06F 1/1641* (2013.01); *G06F 1/1626* (2013.01); *G06F 1/1652* (2013.01); *G06F 1/1656* (2013.01); *G06F 1/203* (2013.01); *H01L 51/529* (2013.01); *H01L 51/5237* (2013.01); *H04M 1/0214* (2013.01); *H04M 1/0268* (2013.01); *H01L 2251/5338* (2013.01)

(58) Field of Classification Search
CPC .... G06F 1/1626; G06F 1/1652; G06F 1/1656; G06F 1/203; H04M 1/0214; H04M 1/0268
See application file for complete search history.

(56) References Cited

U.S. PATENT DOCUMENTS

| 6,480,614 B1 * | 11/2002 | Denda ..................... H04R 7/04 |
| | | 381/191 |
| 7,672,119 B2 | 3/2010 | Hollander |
| 8,654,519 B2 | 2/2014 | Visser et al. |
| 9,665,132 B2 | 5/2017 | Magi |
| D789,925 S | 6/2017 | Magi et al. |

(Continued)

FOREIGN PATENT DOCUMENTS

WO   2018/004937 A1   1/2018

OTHER PUBLICATIONS

International Preliminary Report on Patentability received for International Application No. PCT/US2017/035063, dated Jan. 10, 2019, 14 pages.

(Continued)

*Primary Examiner* — Tuan Pham
(74) *Attorney, Agent, or Firm* — Spectrum IP Law Group LLC

(57) ABSTRACT

Methods and apparatus relating to a magnetic shearing solution allowing integrated folding and/or seamless design for foldable or bendable display form factor devices are described. In an embodiment, rows of magnets disposed between adjoining surfaces of a display device and a computing device chassis are to magnetically couple the devices to maintain the attachment of the devices when they are flexed. Other embodiments are also disclosed and claimed.

25 Claims, 13 Drawing Sheets

(56) References Cited

U.S. PATENT DOCUMENTS

| | | | |
|---|---|---|---|
| D790,531 S | 6/2017 | Magi | |
| 9,829,923 B2 * | 11/2017 | Lee | G06F 1/1679 |
| D808,870 S | 1/2018 | Magi et al. | |
| 9,990,006 B2 | 6/2018 | Magi | |
| 10,034,827 B2 * | 7/2018 | Osborne | A61K 8/64 |
| 10,114,481 B2 | 10/2018 | Magi et al. | |
| 10,310,565 B2 | 6/2019 | Magi et al. | |
| 2008/0176610 A1 * | 7/2008 | Pan | H04M 1/0216 |
| | | | 455/575.3 |
| 2010/0265668 A1 | 10/2010 | Yuen et al. | |
| 2013/0265262 A1 | 10/2013 | Jung et al. | |
| 2014/0307396 A1 | 10/2014 | Lee | |
| 2017/0344120 A1 | 11/2017 | Magi et al. | |

OTHER PUBLICATIONS

International Search Report and Written Opinion received for International Application No. PCT/US2017/035063, dated Sep. 12, 2017, 17 pages.

"Flexible Organic Light-Emitting Diode", https://en.wikipedia.org/wiki/Flexible_organic_light-emitting_diode, Jun. 24, 2016, 3 pages.

* cited by examiner

FIG. 3

MAGNETIC SHEARING SOLUTION ALLOWING INTEGRATED FOLDING AND SEAMLESS DESIGN FOR FOLDABLE/BENDABLE DISPLAY FORM FACTOR DEVICES

FIELD

The present disclosure generally relates to the field of electronics. More particularly, one or more embodiments relate to a magnetic shearing solution allowing integrated folding and seamless design for foldable and/or bendable display form factor devices.

BACKGROUND

Due to their size and portability, small form factor mobile devices are quickly becoming common-place. One current restriction on their usage is that many mobile devices lack the capability to scale in size easily, while maintaining their mobility. The emergence of foldable and bendable displays allows product designs to be flexible in new ways never before seen. However, flexible displays used in some portable devices would be difficult to use or control within a foldable mobile device.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

FIG. 3 illustrates magnetic pole alignment along the display and system/chassis assembly of a mobile computing device, according to an embodiment.

DETAILED DESCRIPTION

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

As mentioned above, flexible displays (such as Organic Light-Emitting Diodes (OLEDs)), which may be used in some portable devices, can be difficult to use or control within a foldable mobile device, e.g., without having exposed rail systems or runways. This presents a number of use issues, including, but not limited to: debris falling into the rail system (potentially, clogging, bending, or breaking the interface in the rail), rail system becoming caught in-pocket or in-bag, and/or wear and tear on rail system (e.g., after repeated use, risk of damage if system is dropped, etc.).

To this end, some embodiments provide a magnetic shearing solution allowing integrated folding and/or seamless design for foldable or bendable display form factor devices. In one or more embodiments, using magnetic attachment paired with flexible polymer (such as Elastomer (or Silicon rubber), Polyamide fabric (e.g., nylon), or like material), the device chassis (or frame) is magnetically coupled to hold a Flexible OLED (FOLED) in place, without exposing internals of the mobile device. As a result, the FOLED is allowed to flex and bend without shearing the screen ingredients (and eliminates physical rail system downsides mentioned above). As discussed herein, one or more embodiments reduce the shearing forces incident on one or more display screens of a device as the device is folded or bent. The shearing forces may normally tear or crack the screen.

Figure 1A:
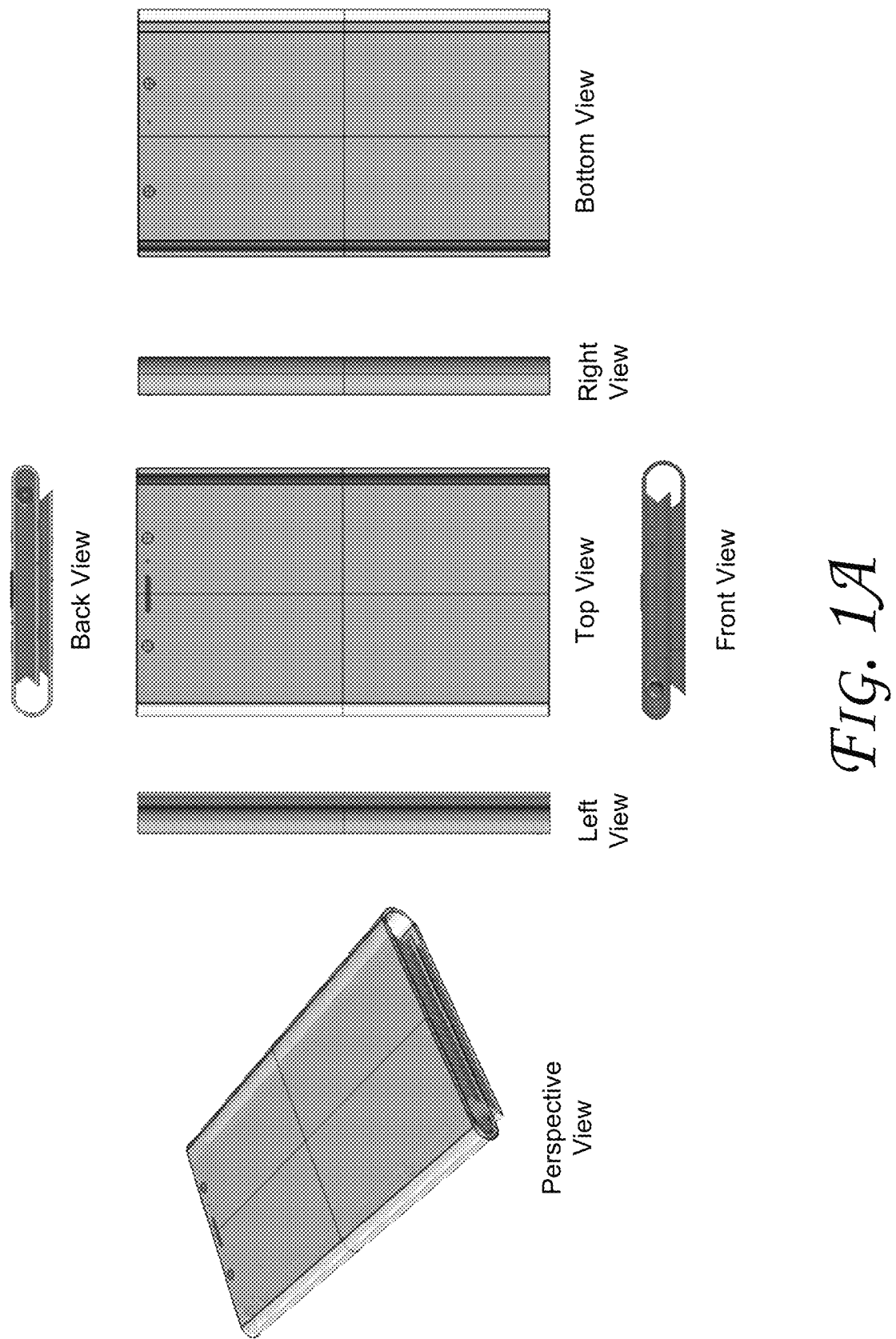
FIGS. 1A and 1B illustrate various views of folded and unfolded mobile device modes, respectively, according to some embodiment.
Figure 1B:
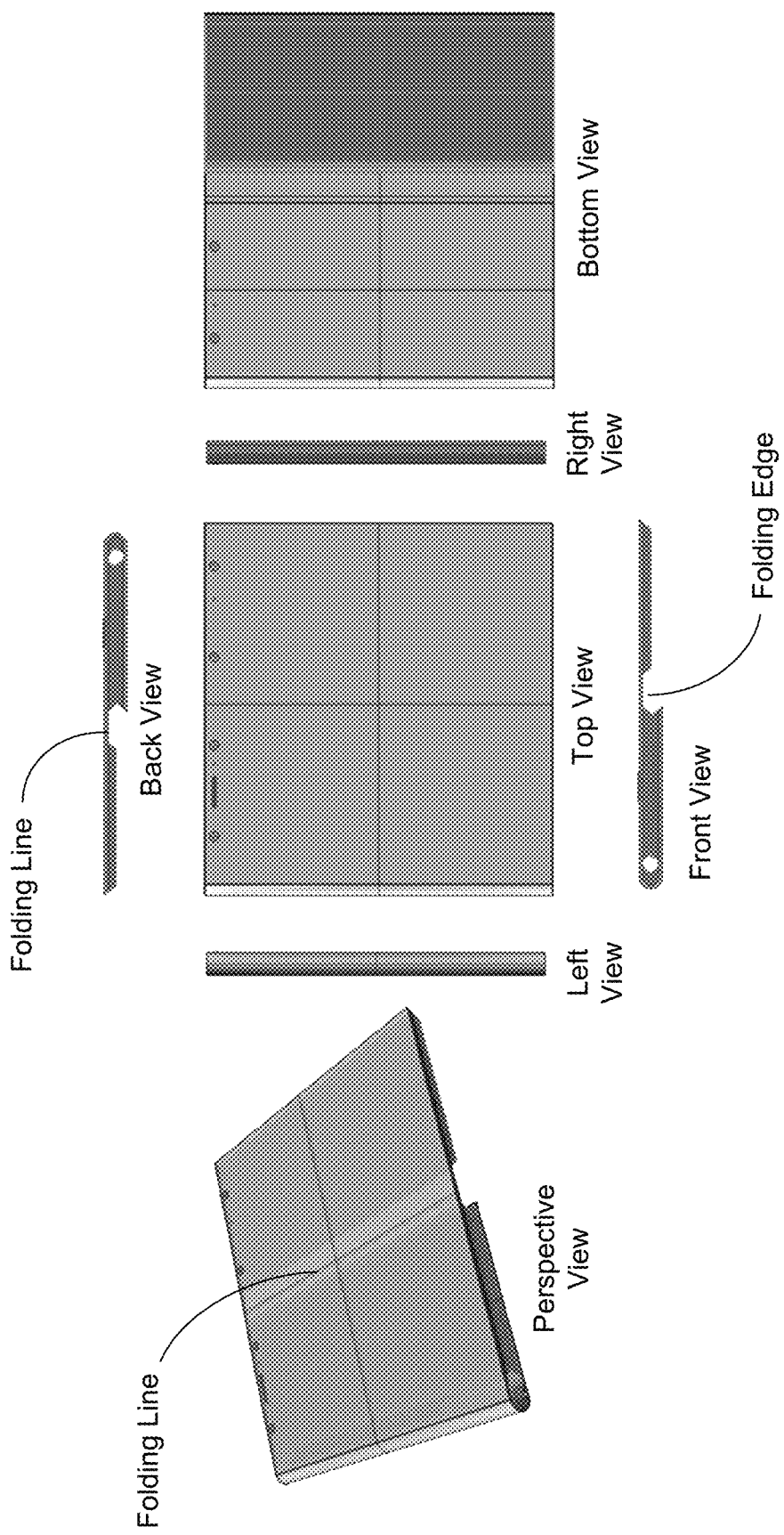

FIGS. 1A and 1B illustrate various views of folded and unfolded mobile device modes, respectively, according to some embodiment. For example, FIG. 1A may be considered as a phone mode of a mobile device (when the mobile device is folded or in single screen mode) and FIG. 1B shows a screen mode of the same mobile device (when the mobile device is unfolded, or in dual/multiple screen mode) to expose more of a display surface.

Figure 1C:
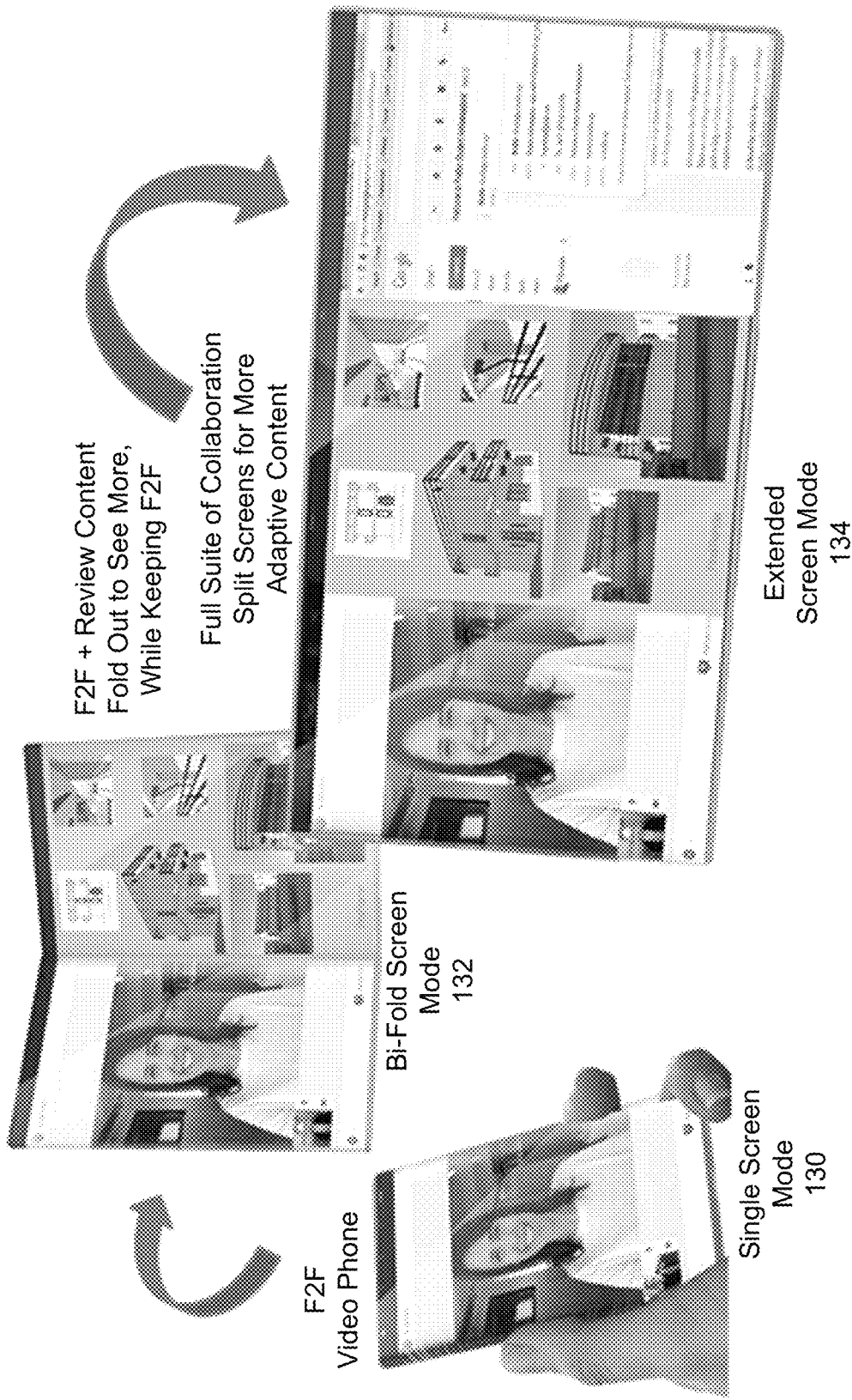
FIG. 1C shows a use case of a folding mobile device, according to an embodiment.

FIG. 1C shows a use case of a folding mobile device, according to an embodiment. More particularly, a use case for seamless collaboration is shown, where Face-to-Face (F2F) communication may be established with the mobile device in the phone (or single screen) mode 130. The device may then be unfolded once to expose a dual screen phone 132 (e.g., to maintain the F2F communication on one screen and display other content (e.g., review content) on a second screen). Yet another (third) screen may be exposed by unfolding the device one more time 134 (for example, to provide yet another display surface for display more (e.g., adaptive) content). Hence, in at least one embodiment, a single mobile device may allow for two or more modes (e.g., single screen mode, bi-fold/dual screen mode, extended/triple screen mode, quad-fold screen mode (not shown), and so on).

Figure 2A:
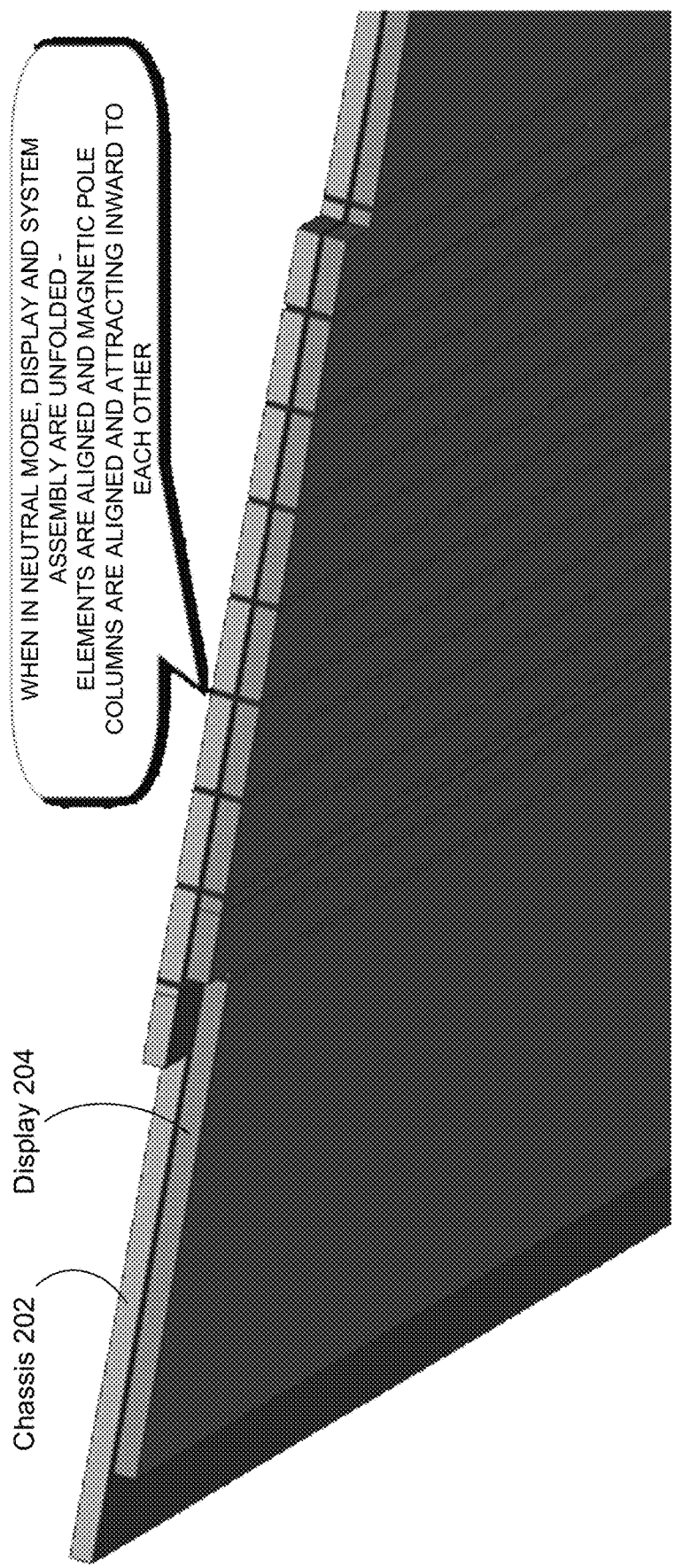
FIG. 2A illustrates a perspective view of a display and chassis assembly of a mobile computing device in a neutral mode, according to an embodiment.

FIG. 2A illustrates a perspective view of a display and chassis assembly of a mobile computing device in a neutral mode, according to an embodiment. When in neutral mode (shown in FIG. 2A), the system chassis 202 and display 204 are unfolded. The system chassis may include computing system components such as one or more components discussed with reference to FIGS. 5-8 (including for example one or more processors (each having one or more processor cores), one or more graphics processing units, memory, display driver circuitry, battery, wired/wireless communication device(s), a speaker, a microphone, one or more cameras, power supply/converter, solar cells (e.g., to generate power and/or charge the battery), one or more input buttons, etc.). Also, since one or more of the computing system components may generate heat, one surface of the chassis (any surface facing away from the display device) may be used as a heat sink to dissipate the heat generated by the component(s). Furthermore, one or more of the system chassis components may be included on the same integrated circuit device (e.g., to form a System on Chip (SOC)) as discussed further with reference to FIGS. 5-8.

Figure 2B:
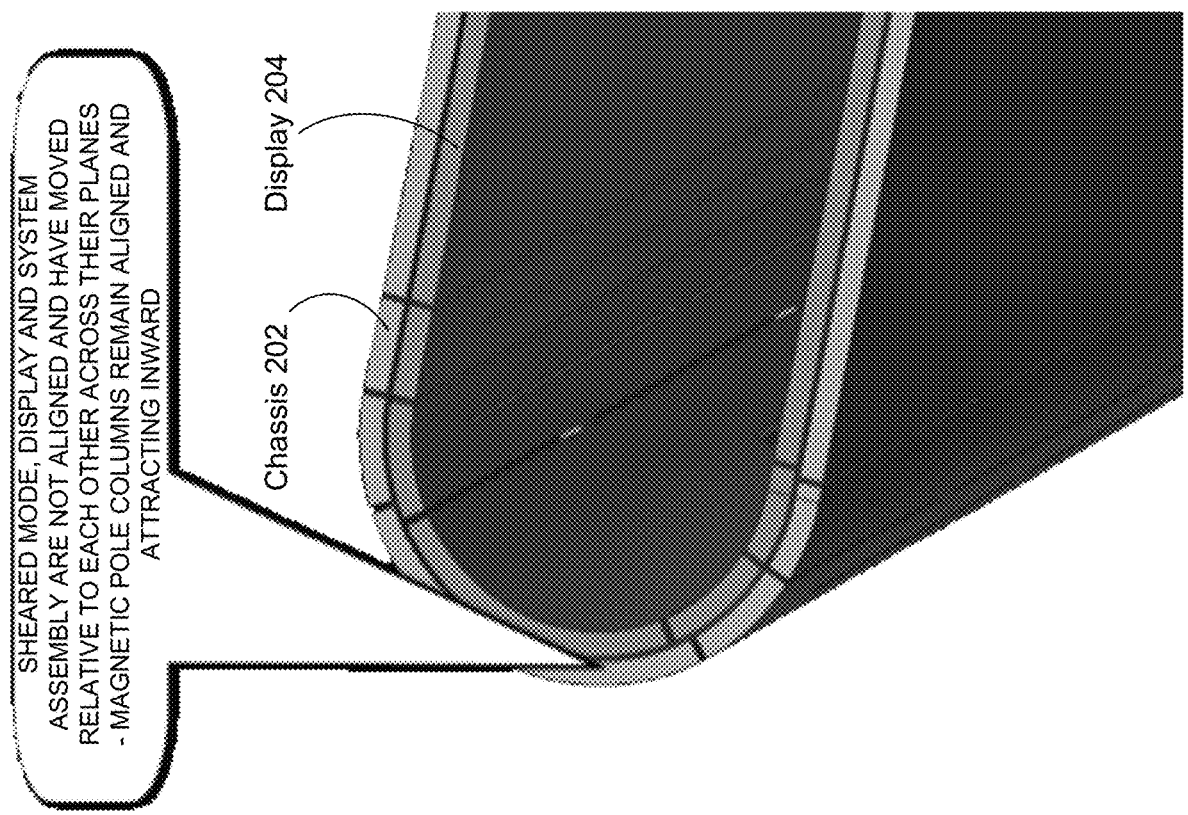
FIG. 2B illustrates a perspective view of a display and chassis assembly of a mobile computing device in a sheared mode, according to an embodiment.

FIG. 2B illustrates a perspective view of a display and chassis assembly of a mobile computing device in a sheared mode, according to an embodiment. When in sheared mode or folded/closed position, display and system assembly are not aligned and have moved relative to each other across their planes—When compared with FIG. 2A, the magnetic pole columns remain aligned and attracting inward to each other.

Figure 2C:
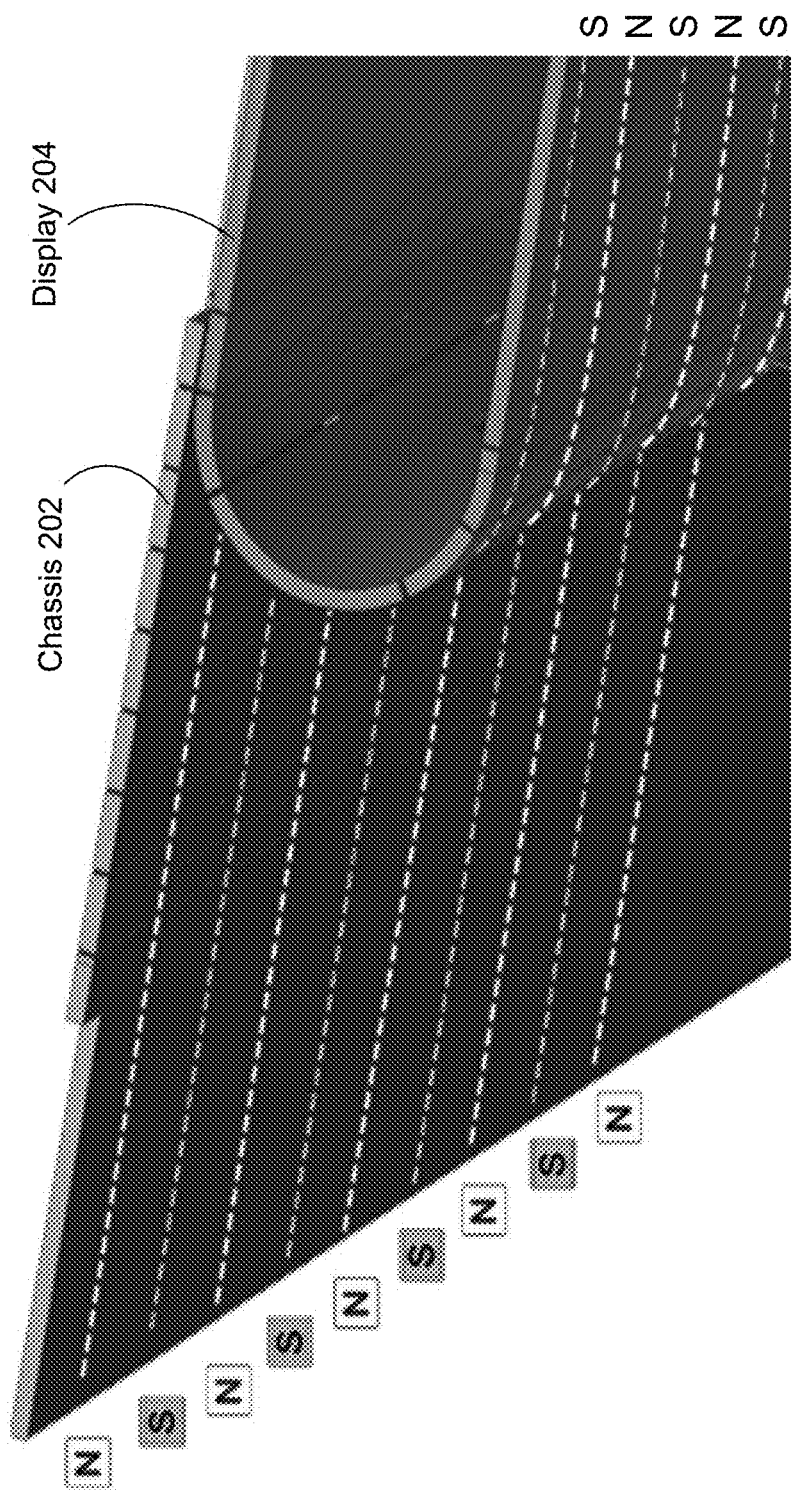
FIG. 2C illustrates a perspective view of magnetic pole configuration for a display and chassis assembly of a mobile computing device, according to an embodiment.

FIG. 2C illustrates a perspective view of magnetic pole configuration for a display and chassis assembly of a mobile computing device, according to an embodiment. As can be seen, FIG. 2C illustrates a perspective view of the display and chassis assembly of FIG. 2B with the chassis portion unfolded to expose the magnetic pole configuration. More particularly, FIG. 2C shows that the N magnetic pole of the magnets on the chassis 202 are aligned with the S magnetic pole of the magnets on the display 204 and vice versa. Hence, opposite magnetic poles from the chassis and display are aligned to attract the two parts to each other. In an embodiment, strips (or series) of magnetic elements (such as shown in FIG. 2C, as highlighted by the dotted lines) may be attached (e.g., glued or embedded) in each device. The magnets may be covered by protective material (e.g., which is fixed to the adhered surface). Hence, the magnets may be sandwiched between the adhered surfaces. The magnets may also be provided as part of a molding process in which the magnets become native in the part (in an embodiment, molding the magnets is feasible, especially along more rigid portions of the display). Each magnet (or magnetic element) in the strip/series (e.g., each dot in the illustrated dotted lines) may include Neodymium magnets. For example, magnets with N42 grade, N52 grade, or their combination may be used, e.g., to keep the size and/or weight to a minimum. Lesser strength magnets may also be used.

While the magnets used may be relatively small (providing small cross-sectional magnetic areas), due to the number of the magnets (see, sample dots in FIG. 2C, for example), sufficient magnetic attraction is provided to hold the display and chassis together. Also, in an embodiment, while the display and chassis may be separated, they may be allowed to combined back together. In one embodiment, an edge railing or frame may be provided along the edges of the display and the chassis to provide additional structural rigidity or retaining mechanism. The magnets would then keep the display flush with the adjacent surface of the chassis.

Also, while magnetic fields may have a negative effect on CRT (Cathode Ray Tube) display device, one or more embodiments utilize TFT (Thin Film Transistor) display devices (e.g., OLED or FOLED devices) which are not affected by the magnetic field of the magnets. Further, the magnetic fields are contained to the arrays discussed herein (see, e.g., FIG. 3).

Moreover, the friction generated by the magnets between the adjacent display/chassis surfaces may be adjusted to provide a coefficient of friction that results in a smooth slide between the surfaces. In an embodiment a Ferro-fluid or oil may be used as a lubricant, e.g., since it would keep the material more contained. A gasket may be provided to avoid fluid/oil leakage. Also, a dry lubricant with nick or a low coefficient coating may also be used.

Figure 3:
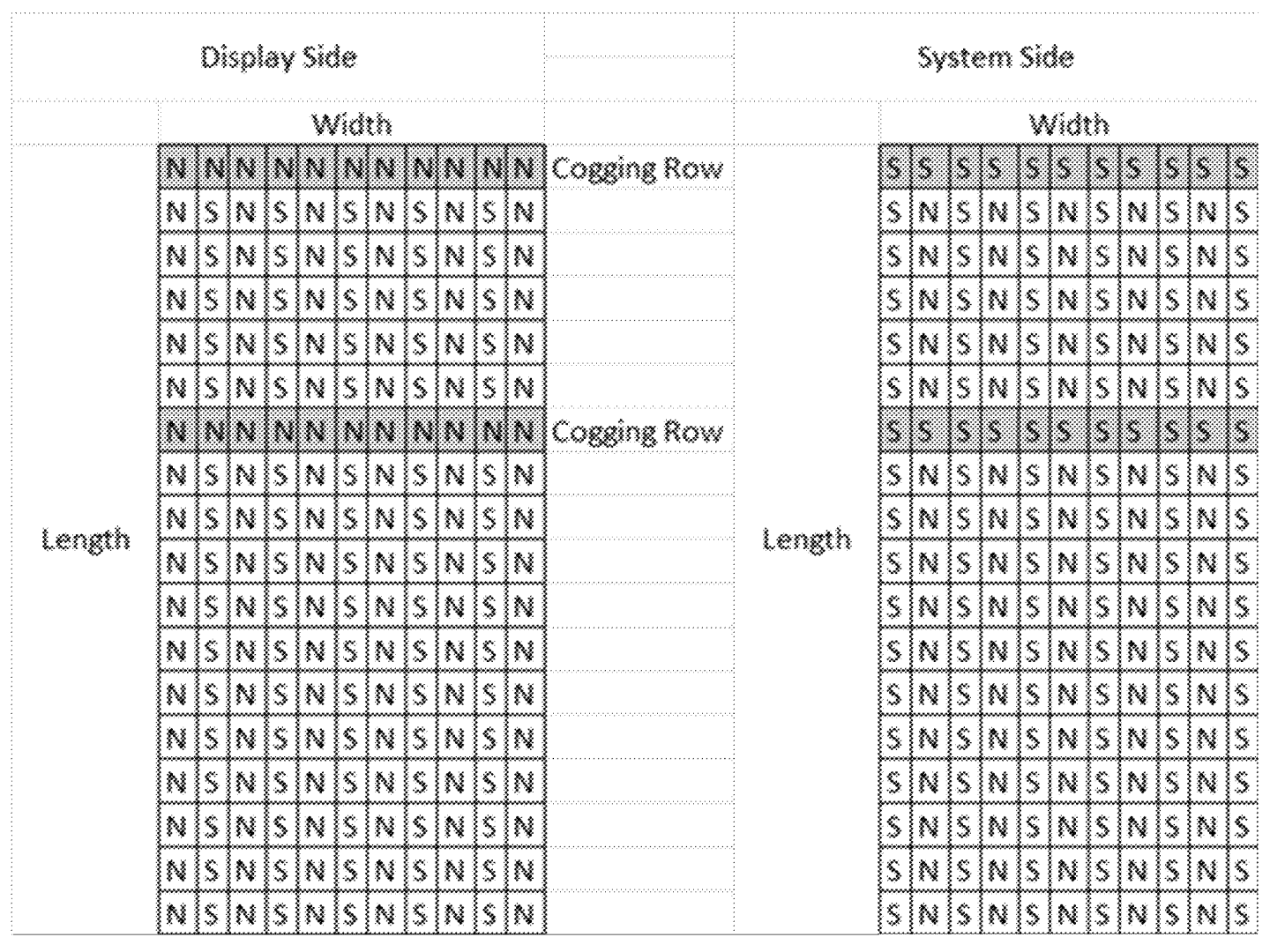

FIG. 3 illustrates magnetic pole alignment along the display and system/chassis assembly of a mobile computing device, according to an embodiment. FIG. 3 illustrates a top view of the magnetic alignment for the display and system/chassis sides for simplicity (e.g., if the two sides where disassembled and placed flat on a surface). North/South (N/S) poles attract, while same poles repel (S/S or N/N).

When the system/display assembly is in the neutral (or open position) (FIG. 2A), "elemental" locations are aligned (wherein "elemental" items include the one or more display screens show in FIG. 1C). As the system closes (or is folded) (FIG. 2B), these elements experience a shear force or mechanically strain between the system side and display side. The attractive magnetic field is normal (or perpendicular) to the assembly plane, keeping the display side and system side coincident (FIG. 2C). Simultaneously, the magnetic field is minimally interrupted through the direction of the shearing displacement.

Referring to FIG. 3, the magnetic field pole arrangement can be varied as long as they are consistent with the motion of the shearing of the fold. In the example provided, the shearing forces are parallel to the N/S pole columns of a full pole array. Hence, in the example of FIG. 3, folding of the device occurs in the same plane as the width of the display/system (or otherwise the folding occurs in a line that is horizontal or parallel to the rows in FIG. 3). For example, as the device is "folded" to BiFold Screen Mode and to Single Screen Mode, the folding occurs parallel to the horizon in FIG. 3. In other words, as a user is holding the device in landscape mode (e.g., as in FIG. 1C), the folding would occur on the vertical axis. Furthermore, the magnetic attachment may mimic a physical rail system without the downsides of over usage, debris collection, etc. issues discussed herein with reference to a physical rail system.

In an embodiment, haptic feedback can be achieved by selectively orienting the magnetic pole array rows. Namely, when the corresponding rows (e.g., from the screen side and the chassis side) align in complimentive positions, a "cogging" feel results from the aligned interacting rows. Multiple rows can be used to modulate the haptic force. The criteria used for determining cogging rows may be dependent on the device preferences for device type. In the designs shown in the figures herein, the cogging rows are selected for ease of cogging (or "keying") into specific modes like Single Screen Mode, Two Screen Mode, Full Tablet Mode, Pillar Mode (triangular pillar with the device edges in or near contact), etc. For example, FIG. 2B shows how cogging can be set or keyed into a fixed position. In one embodiment, the cogging rows may be provided at folding line(s) of the display device or the chassis (such as those shown in FIG. 1B), e.g., where the two or more screens discussed herein meet. More or less cogging rows may be provided in various embodiments. As shown in FIG. 3, each cogging row includes a series of magnets have the same polarity on one side (e.g., display side) with opposite polarity of magnets in series on the other side (e.g., system/chassis side).

Figure 4A:
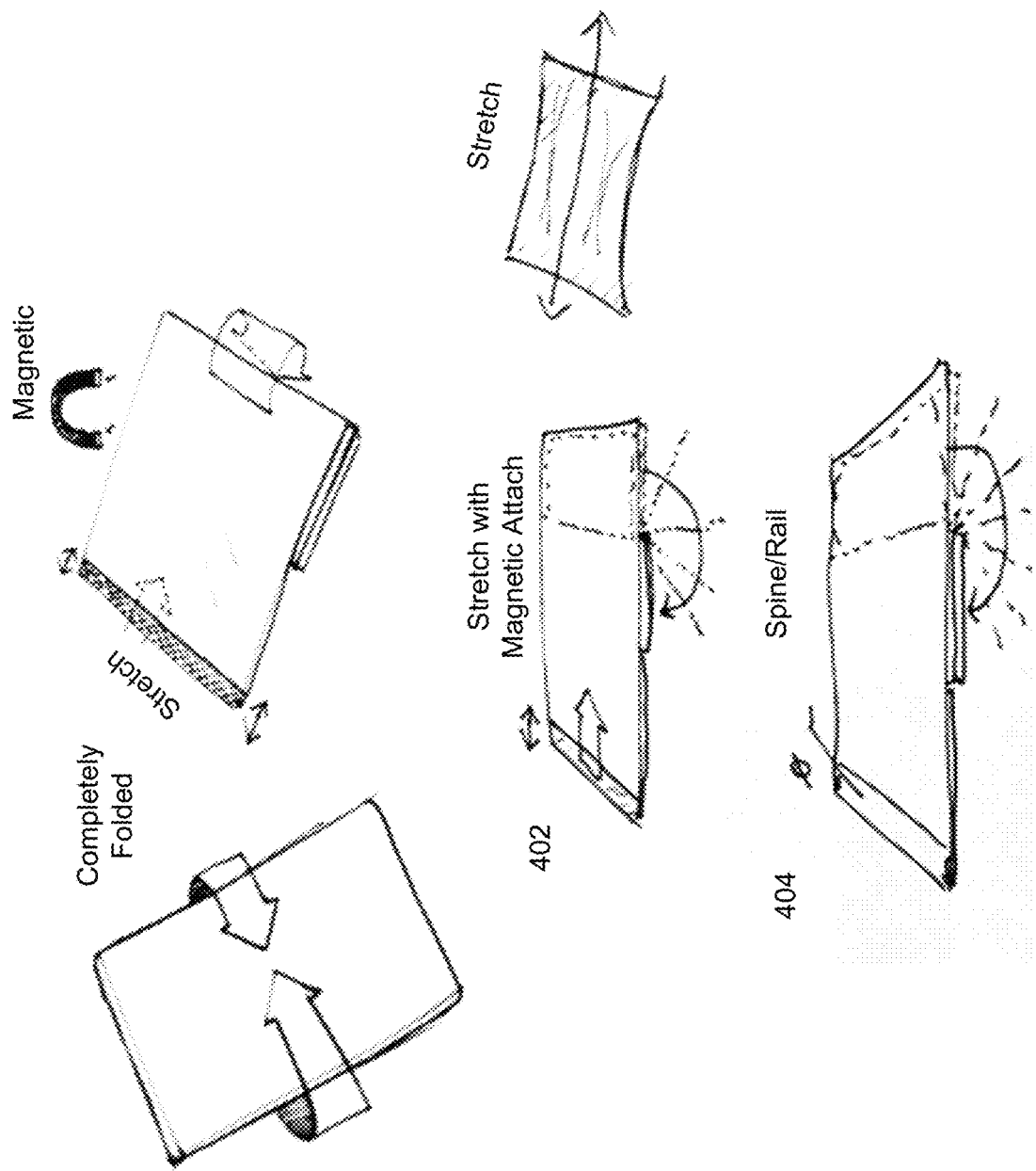
FIG. 4A shows various views of an upper portion of a mobile computing device, according to an embodiment.

FIG. 4A shows various views of an upper portion of a mobile computing device, according to an embodiment. In an embodiment, stretchable material (such as fabric or silicon are used (e.g., on the left and/or right sides of the device) to allow for rolling. Also, magnetic attach may be used in an embodiment (402) to address overuse and/or debris risks mentioned before with reference to a rail-based design with no stretchable and/or magnetic material (404).

Figure 4B:
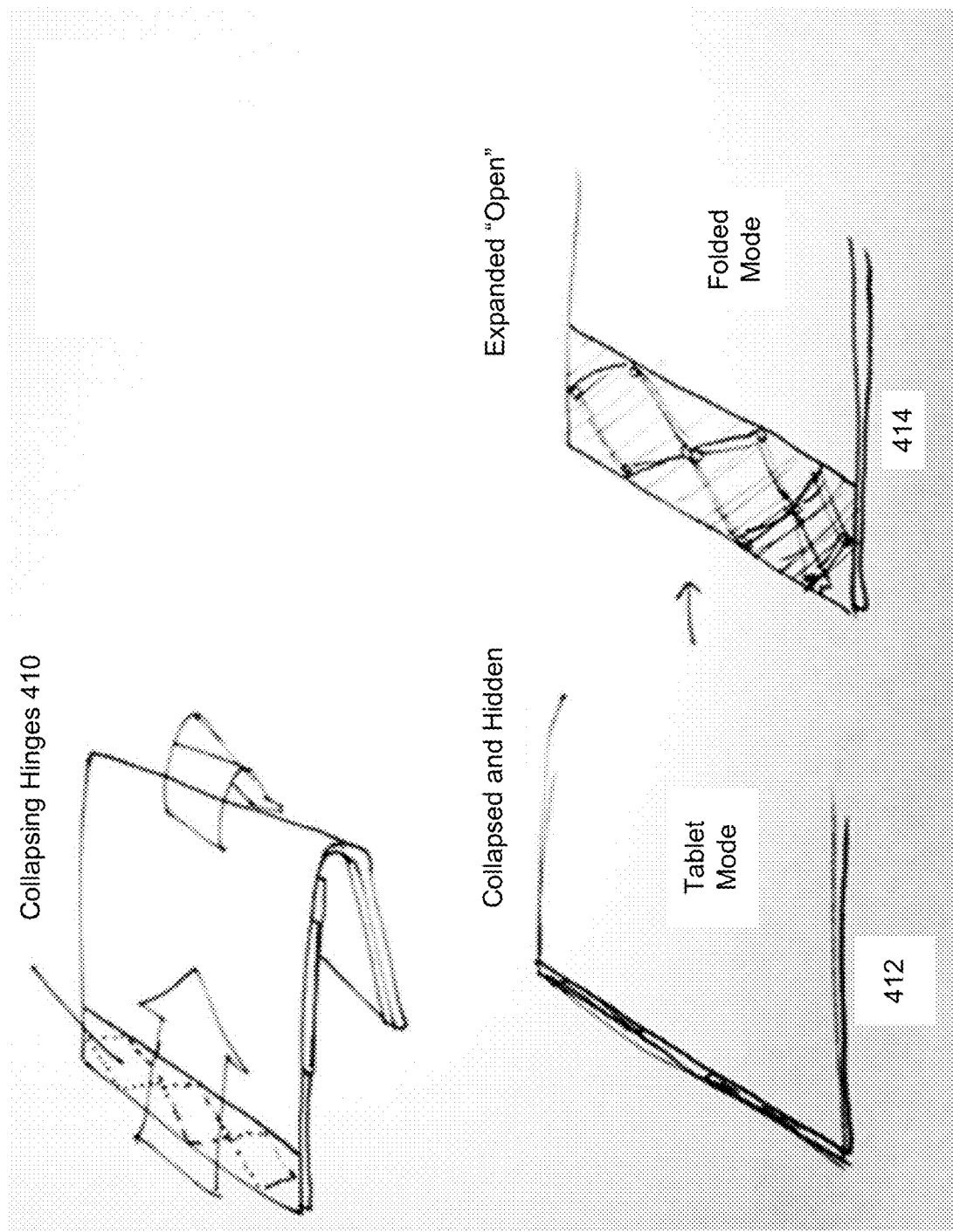
FIG. 4B illustrates various view of a hinge/louver portion of a mobile computing device, according to an embodiment.

FIG. 4B illustrates various view of a hinge/louver portion of a mobile computing device, according to an embodiment. As shown, collapsing hinges 410 (e.g., with three hinges) may be used in one embodiment. Moreover, the hinges may be hidden in a tablet mode 412 and covered in a folded mode 414. Also, a Neoprene™ or other types of synthetic rubbers (or stretchable material) may be used as a holder for top and bottom portions of the device, instead of or in addition to the hinge/louver configuration.

In one or more embodiments, while the FOLED is flexible, it can be mated to a chassis that is not flexible. There are one or more advantages to the use of magnets to mate the display and the chassis, including for example, first that this configuration allows the FOLED the flexibility to move slightly when mated to the chassis, which may help reduce damage due to bumps or drops. This may reduce damage to the FOLED. Second, the FOLED (while may be completely flexible) will be able to bend at the same places as the chassis.

Additionally, the cogging rows may serve two purposes: (1) they help align the FOLED to the chassis; and/or (2) when the cogging rows match up, they may create a haptic feedback that is pleasant to the user. If the cogging rows are positioned based on the display unfolded, then there can be haptic feedback when the chassis is completed opened. In contrast, if the cogging rows are positioned based on the display folded, then there can be haptic feedback when the chassis is folded. Furthermore, positioning the cogging rows at (or near) the pivot points on the chassis may give the sensation that the foldable display is locking (or clicking) into one of the designated modes.

Furthermore, some embodiments may be applied in computing devices that include one or more processors (e.g., with one or more processor cores), such as those discussed with reference to FIGS. 5-8, including for example small form factor or mobile computing devices, e.g., a smartphone, tablet, UMPC (Ultra-Mobile Personal Computer), laptop computer, Ultrabook™ computing device, wearable devices (such as a smart watch, smart glasses, etc.), 2 in 1 systems, etc. However, embodiments discussed herein are not limited to mobile computing devices and may be applied in any type of computing device, such as a work station, a server, a super computer, etc. Also, some embodiments are applied in computing devices that include a cooling fan as well as fanless computing devices.

Figure 5:
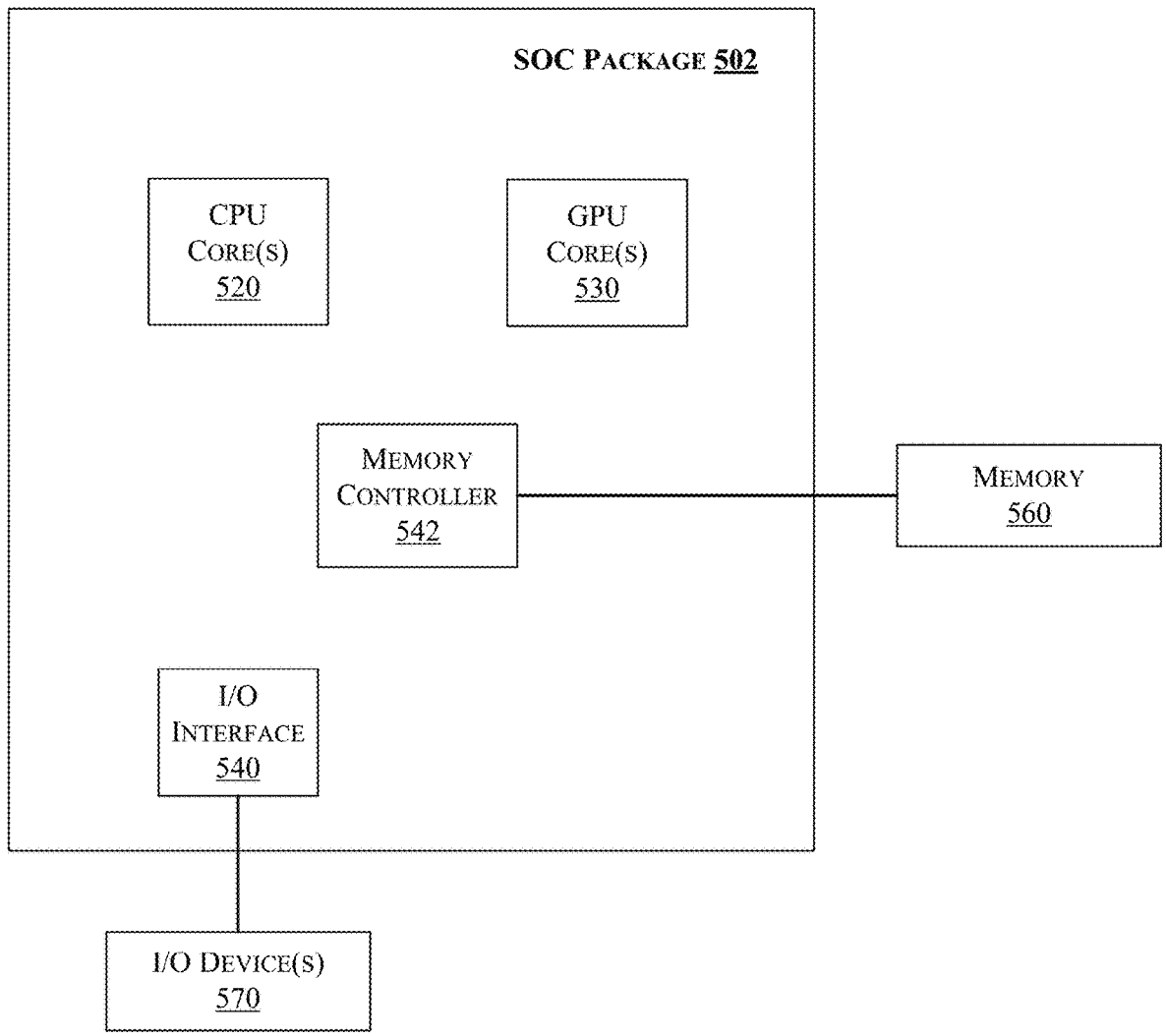
FIGS. 5 and 6 illustrate block diagrams of embodiments of computing systems, which may be utilized in various embodiments discussed herein.

Also, one or more of the components discussed herein can be embodied as a System On Chip (SOC) device. FIG. 5 illustrates a block diagram of an SOC package in accordance with an embodiment. As illustrated in FIG. 5, SOC 502 includes one or more Central Processing Unit (CPU) cores 520, one or more Graphics Processor Unit (GPU) cores 530, an Input/Output (I/O) interface 540, and a memory controller 542. Various components of the SOC package 502 may be coupled to an interconnect or bus such as discussed herein with reference to the other figures. Also, the SOC package 502 may include more or less components, such as those discussed herein with reference to the other figures. Further, each component of the SOC package 520 may include one or more other components, e.g., as discussed with reference to the other figures herein. In one embodiment, SOC package 502 (and its components) is provided on one or more Integrated Circuit (IC) die, e.g., which are packaged into a single semiconductor device.

As illustrated in FIG. 5, SOC package 502 is coupled to a memory 560 via the memory controller 542. In an embodiment, the memory 560 (or a portion of it) can be integrated on the SOC package 502.

The I/O interface 540 may be coupled to one or more I/O devices 570, e.g., via an interconnect and/or bus such as discussed herein with reference to other figures. I/O device(s) 570 may include one or more of a keyboard, a mouse, a touchpad, a display, an image/video capture device (such as a camera or camcorder/video recorder), a touch screen, a speaker, or the like.

Figure 6:
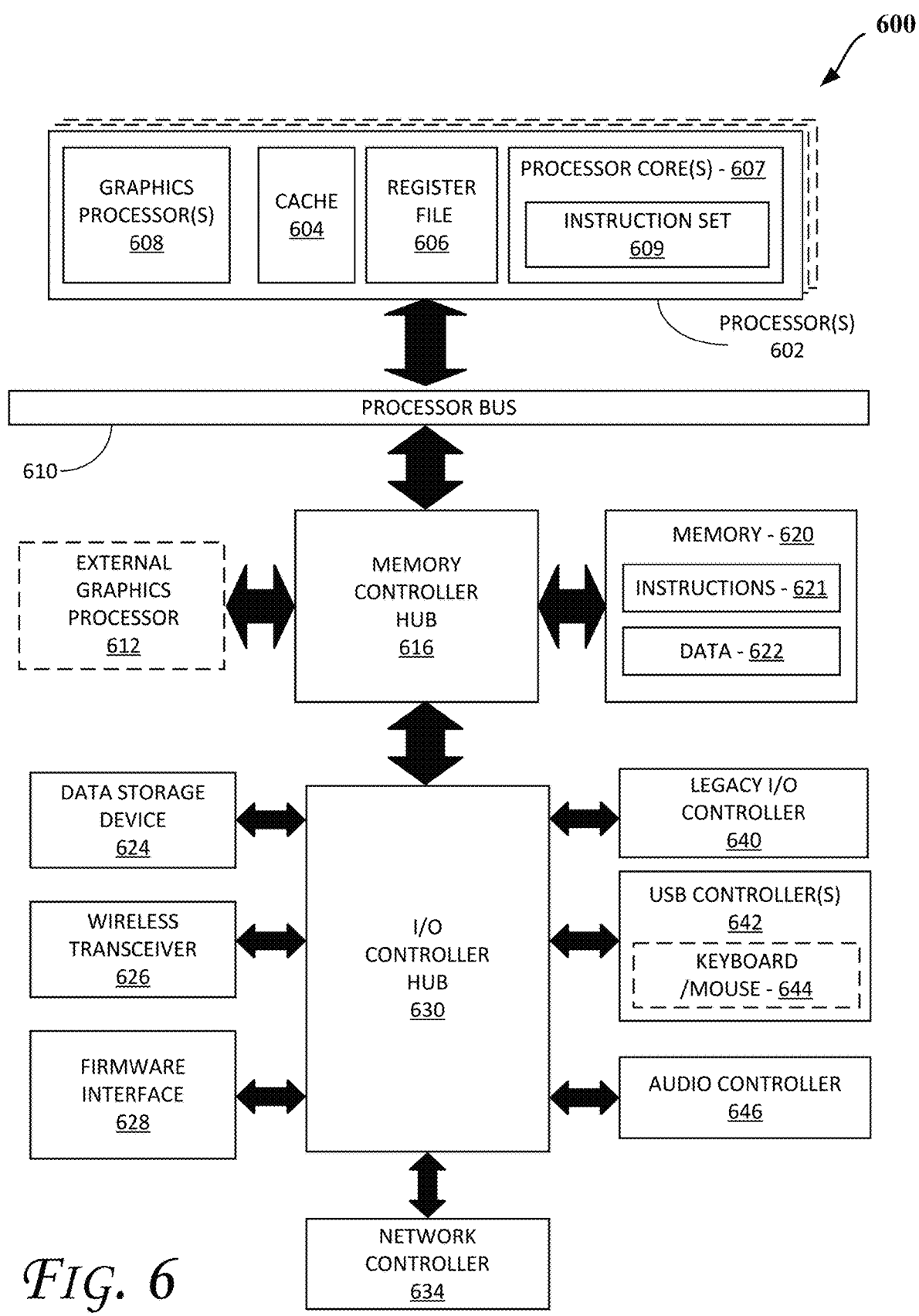

FIG. 6 is a block diagram of a processing system 600, according to an embodiment. In various embodiments the system 600 includes one or more processors 602 and one or more graphics processors 608, and may be a single processor desktop system, a multiprocessor workstation system, or a server system having a large number of processors 602 or processor cores 607. In on embodiment, the system 600 is a processing platform incorporated within a system-on-a-chip (SoC) integrated circuit for use in mobile, handheld, or embedded devices.

An embodiment of system 600 can include, or be incorporated within a server-based gaming platform, a game console, including a game and media console, a mobile gaming console, a handheld game console, or an online game console. In some embodiments system 600 is a mobile phone, smart phone, tablet computing device or mobile Internet device. Data processing system 600 can also include, couple with, or be integrated within a wearable device, such as a smart watch wearable device, smart eyewear device, augmented reality device, or virtual reality device. In some embodiments, data processing system 600 is a television or set top box device having one or more processors 602 and a graphical interface generated by one or more graphics processors 608.

In some embodiments, the one or more processors 602 each include one or more processor cores 607 to process instructions which, when executed, perform operations for system and user software. In some embodiments, each of the one or more processor cores 607 is configured to process a specific instruction set 609. In some embodiments, instruction set 609 may facilitate Complex Instruction Set Computing (CISC), Reduced Instruction Set Computing (RISC), or computing via a Very Long Instruction Word (VLIW). Multiple processor cores 607 may each process a different instruction set 609, which may include instructions to facilitate the emulation of other instruction sets. Processor core 607 may also include other processing devices, such a Digital Signal Processor (DSP).

In some embodiments, the processor 602 includes cache memory 604. Depending on the architecture, the processor 602 can have a single internal cache or multiple levels of internal cache. In some embodiments, the cache memory is shared among various components of the processor 602. In some embodiments, the processor 602 also uses an external cache (e.g., a Level-3 (L3) cache or Last Level Cache (LLC)) (not shown), which may be shared among processor cores 607 using known cache coherency techniques. A register file 606 is additionally included in processor 602 which may include different types of registers for storing different types of data (e.g., integer registers, floating point registers, status registers, and an instruction pointer register). Some registers may be general-purpose registers, while other registers may be specific to the design of the processor 602.

In some embodiments, processor 602 is coupled to a processor bus 610 to transmit communication signals such as address, data, or control signals between processor 602 and other components in system 600. In one embodiment the system 600 uses an exemplary 'hub' system architecture, including a memory controller hub 616 and an Input Output (I/O) controller hub 630. A memory controller hub 616 facilitates communication between a memory device and other components of system 600, while an I/O Controller Hub (ICH) 630 provides connections to I/O devices via a local I/O bus. In one embodiment, the logic of the memory controller hub 616 is integrated within the processor.

Memory device 620 can be a dynamic random access memory (DRAM) device, a static random access memory (SRAM) device, flash memory device, phase-change memory device, or some other memory device having suitable performance to serve as process memory. In one embodiment the memory device 620 can operate as system memory for the system 600, to store data 622 and instructions 621 for use when the one or more processors 602 executes an application or process. Memory controller hub 616 also couples with an optional external graphics processor 612, which may communicate with the one or more graphics processors 608 in processors 602 to perform graphics and media operations.

In some embodiments, ICH 630 enables peripherals to connect to memory device 620 and processor 602 via a high-speed I/O bus. The I/O peripherals include, but are not limited to, an audio controller 646, a firmware interface 628, a wireless transceiver 626 (e.g., Wi-Fi, Bluetooth), a data storage device 624 (e.g., hard disk drive, flash memory, etc.), and a legacy I/O controller 640 for coupling legacy (e.g., Personal System 2 (PS/2)) devices to the system. One or more Universal Serial Bus (USB) controllers 642 connect input devices, such as keyboard and mouse 644 combinations. A network controller 634 may also couple to ICH 630. In some embodiments, a high-performance network controller (not shown) couples to processor bus 610. It will be appreciated that the system 600 shown is exemplary and not limiting, as other types of data processing systems that are differently configured may also be used. For example, the I/O controller hub 630 may be integrated within the one or more processor 602, or the memory controller hub 616 and I/O controller hub 630 may be integrated into a discreet external graphics processor, such as the external graphics processor 612.

Figure 7:
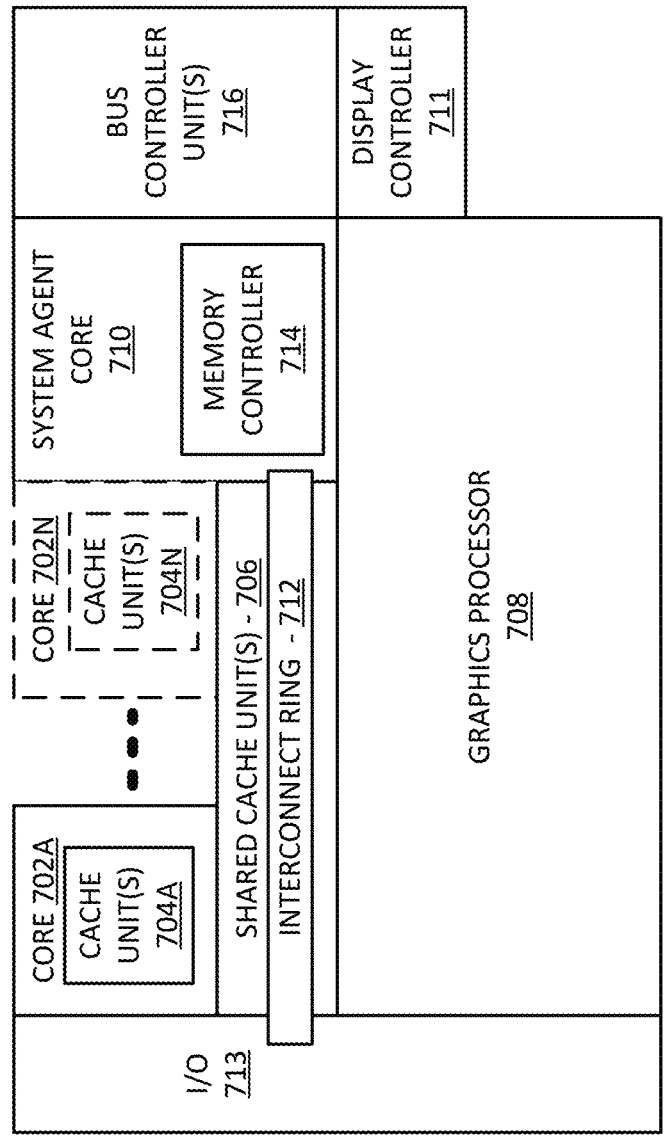
FIGS. 7 and 8 illustrate various components of processers in accordance with some embodiments.

FIG. 7 is a block diagram of an embodiment of a processor 700 having one or more processor cores 702A-702N, an integrated memory controller 714, and an integrated graphics processor 708. Those elements of FIG. 7 having the same reference numbers (or names) as the elements of any other figure herein can operate or function in any manner similar to that described elsewhere herein, but are not limited to such. Processor 700 can include additional cores up to and including additional core 702N represented by the dashed lined boxes. Each of processor cores 702A-702N includes one or more internal cache units 704A-704N. In some embodiments each processor core also has access to one or more shared cached units 706.

The internal cache units 704A-704N and shared cache units 706 represent a cache memory hierarchy within the processor 700. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 706 and 704A-704N.

In some embodiments, processor 700 may also include a set of one or more bus controller units 716 and a system agent core 710. The one or more bus controller units 716 manage a set of peripheral buses, such as one or more Peripheral Component Interconnect buses (e.g., PCI, PCI Express). System agent core 710 provides management functionality for the various processor components. In some embodiments, system agent core 710 includes one or more integrated memory controllers 714 to manage access to various external memory devices (not shown).

In some embodiments, one or more of the processor cores 702A-702N include support for simultaneous multi-threading. In such embodiment, the system agent core 710 includes components for coordinating and operating cores 702A-702N during multi-threaded processing. System agent core 710 may additionally include a power control unit (PCU), which includes logic and components to regulate the power state of processor cores 702A-702N and graphics processor 708.

In some embodiments, processor 700 additionally includes graphics processor 708 to execute graphics processing operations. In some embodiments, the graphics processor 708 couples with the set of shared cache units 706, and the system agent core 710, including the one or more integrated memory controllers 714. In some embodiments, a display controller 711 is coupled with the graphics processor 708 to drive graphics processor output to one or more coupled displays. In some embodiments, display controller 711 may be a separate module coupled with the graphics processor via at least one interconnect, or may be integrated within the graphics processor 708 or system agent core 710.

In some embodiments, a ring based interconnect unit 712 is used to couple the internal components of the processor 700. However, an alternative interconnect unit may be used, such as a point-to-point interconnect, a switched interconnect, or other techniques, including techniques well known in the art. In some embodiments, graphics processor 708 couples with the ring interconnect 712 via an I/O link 713.

The exemplary I/O link 713 represents at least one of multiple varieties of I/O interconnects, including an on package I/O interconnect which facilitates communication between various processor components and a high-performance embedded memory module 718, such as an eDRAM (or embedded DRAM) module. In some embodiments, each of the processor cores 702-702N and graphics processor 708 use embedded memory modules 718 as a shared Last Level Cache.

In some embodiments, processor cores 702A-702N are homogenous cores executing the same instruction set architecture. In another embodiment, processor cores 702A-702N are heterogeneous in terms of instruction set architecture (ISA), where one or more of processor cores 702A-702N execute a first instruction set, while at least one of the other cores executes a subset of the first instruction set or a different instruction set. In one embodiment processor cores 702A-702N are heterogeneous in terms of microarchitecture, where one or more cores having a relatively higher power consumption couple with one or more power cores having a lower power consumption. Additionally, processor 700 can be implemented on one or more chips or as an SoC integrated circuit having the illustrated components, in addition to other components.

Figure 8:
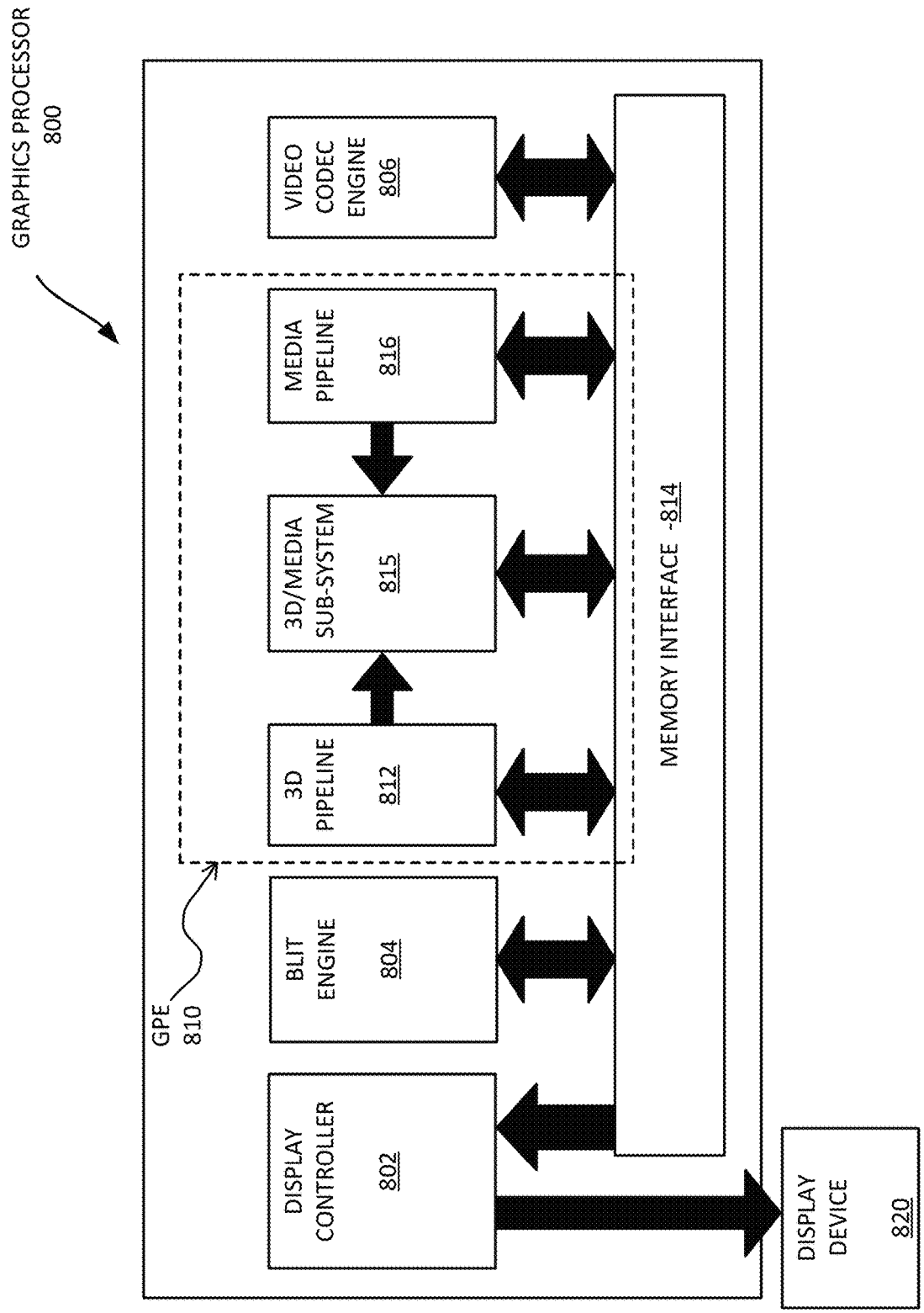

FIG. 8 is a block diagram of a graphics processor 800, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 800 includes a memory interface 814 to access memory. Memory interface 814 can be an interface to local memory, one or more internal caches, one or more shared external caches, and/or to system memory.

In some embodiments, graphics processor 800 also includes a display controller 802 to drive display output data to a display device 820. Display controller 802 includes hardware for one or more overlay planes for the display and composition of multiple layers of video or user interface elements. In some embodiments, graphics processor 800 includes a video codec engine 806 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 800 includes a block image transfer (BLIT) engine 804 to perform two-dimensional (2D) rasterizer operations including, for example, bit-boundary block transfers. However, in one embodiment, 8D graphics operations are performed using one or more components of graphics processing engine (GPE) 810. In some embodiments, graphics processing engine 810 is a compute engine for performing graphics operations, including three-dimensional (3D) graphics operations and media operations.

In some embodiments, GPE 810 includes a 3D pipeline 812 for performing 3D operations, such as rendering three-dimensional images and scenes using processing functions that act upon 3D primitive shapes (e.g., rectangle, triangle, etc.). The 3D pipeline 812 includes programmable and fixed function elements that perform various tasks within the element and/or spawn execution threads to a 3D/Media sub-system 815. While 3D pipeline 812 can be used to perform media operations, an embodiment of GPE 810 also includes a media pipeline 816 that is specifically used to perform media operations, such as video post-processing and image enhancement.

In some embodiments, media pipeline 816 includes fixed function or programmable logic units to perform one or more specialized media operations, such as video decode acceleration, video de-interlacing, and video encode acceleration in place of, or on behalf of video codec engine 806. In some embodiments, media pipeline 816 additionally includes a thread spawning unit to spawn threads for execution on 3D/Media sub-system 815. The spawned threads perform computations for the media operations on one or more graphics execution units included in 3D/Media subsystem 815.

In some embodiments, 3D/Media subsystem 815 includes logic for executing threads spawned by 3D pipeline 812 and media pipeline 816. In one embodiment, the pipelines send thread execution requests to 3D/Media subsystem 815, which includes thread dispatch logic for arbitrating and dispatching the various requests to available thread execution resources. The execution resources include an array of graphics execution units to process the 3D and media threads. In some embodiments, 3D/Media subsystem 815 includes one or more internal caches for thread instructions and data. In some embodiments, the subsystem also includes shared memory, including registers and addressable memory, to share data between threads and to store output data.

The following examples pertain to further embodiments. Example 1 may optionally include an apparatus comprising: a first plurality of rows of magnets disposed on a first surface of a display device, wherein a second plurality of rows of magnets, disposed on a first surface of a chassis, is to magnetically couple to the first plurality of rows of magnets. Example 2 may optionally include the apparatus of example 1, wherein opposite magnetic poles from the first plurality of rows of magnets and the second plurality of rows of magnets are to be aligned to magnetically attract the display device and the chassis to each other. Example 3 may optionally include the apparatus of example 1, wherein one or more rows of the first plurality of rows of magnets is to comprise magnets with alternating magnetic polarity. Example 4 may optionally include the apparatus of example 1, wherein all magnets in at least one row of the first plurality of rows of magnets is to comprise magnets with a same magnetic polarity. Example 5 may optionally include the apparatus of example 4, wherein the display device is to be foldable at or near the at least one row of the first plurality of rows. Example 6 may optionally include the apparatus of example 1, wherein the display device is flexible, wherein the first plurality of rows of magnets and the second plurality of rows of magnets are to maintain proximity of the display device and the chassis as they are flexed. Example 7 may optionally include the apparatus of example 1, wherein the display device is to comprise one or more of: a Thin Film Transistor (TFT) display device, an Organic Light-Emitting Diode (OLED) display device, and a Flexible OLED (FOLED) display device. Example 8 may optionally include the apparatus of example 1, wherein the first surface of the display device is a back side of the display device that faces away from a second surface of the display device that is to display images. Example 9 may optionally include the apparatus of example 1, wherein the first plurality of rows of magnets are parallel to each other. Example 10 may optionally include the apparatus of example 1, wherein the first surface of the display device and the first surface of the chassis are to be coupled via a Ferro-fluid or oil.

Example 11 may optionally include an apparatus comprising: a first plurality of rows of magnets disposed on a first surface of a chassis, wherein a second plurality of rows of magnets, disposed on a first surface of a display device, is to magnetically couple to the first plurality of rows of magnets. Example 12 may optionally include the apparatus of example 11, wherein opposite magnetic poles from the first plurality of rows of magnets and the second plurality of rows of magnets are to be aligned to magnetically attract the display device and the chassis to each other. Example 13 may optionally include the apparatus of example 11, wherein one or more rows of the first plurality of rows of magnets is to comprise magnets with alternating magnetic polarity. Example 14 may optionally include the apparatus of example 11, wherein all magnets in at least one row of the second plurality of rows of magnets is to comprise magnets with a same magnetic polarity. Example 15 may optionally include the apparatus of example 14, wherein the chassis is to be foldable at or near the at least one row of the first plurality of rows. Example 16 may optionally include the apparatus of example 11, wherein the display device is flexible, wherein the first plurality of rows of magnets and the second plurality of rows of magnets are to maintain proximity of the display device and the chassis as they are flexed. Example 17 may optionally include the apparatus of example 11, wherein the chassis is to comprise a computing device chassis, wherein the computing device chassis is to comprise one or more: a processor core, a graphics processing unit, memory, display driver circuitry, battery, wired or wireless communication device, a speaker, a microphone, one or more cameras, power supply, a power converter, solar cells, and one or more input buttons. Example 18 may optionally include the apparatus of example 17, wherein the solar cells are to be exposed on a second surface of the chassis that faces away from the first surface of the chassis. Example 19 may optionally include the apparatus of example 11, wherein a second surface of the chassis, which is on an opposite side of the chassis from the first surface of the chassis, is to operate as a heat sink for one or more heat generating components of the chassis. Example 20 may optionally include the apparatus of example 11, wherein the first plurality of rows of magnets are parallel to each other. Example 21 may optionally include the apparatus of example 11, wherein the first surface of the display device and the first surface of the chassis are to be coupled via a Ferro-fluid or oil.

Example 22 may optionally include a computing system comprising: a chassis to house one or more processor cores, memory, a battery, a wireless communication device; and a display device coupled to the chassis via a magnetic coupling to be established between a first plurality of magnets, disposed on a first surface of the display device, and a second plurality of magnets disposed on a first surface of the chassis. Example 23 may optionally include the system of example 22, wherein at least one row of the first plurality of rows of magnets is to comprise magnets with a first magnetic polarity, wherein at least one row of the second plurality of rows of magnets is to comprise magnets with a second magnetic polarity, wherein the at least one row of the first plurality of rows of magnets and the at least one row of the second plurality of rows of magnets are to be aligned to provide a cogging row. Example 24 may optionally include the system of example 22, wherein the first plurality of magnets and the second plurality of magnets are to comprise N42 or N52 Neodymium magnets. Example 25 may optionally include the system of example 22, wherein one or more of the one or more processor cores, memory, and wireless communication device are to be located on a same integrated circuit device. Example 26 may optionally include the system of example 22, wherein one or more rows of the first plurality of rows of magnets or the second plurality of rows of magnets are to comprise magnets with alternating magnetic polarity. Example 27 may optionally include the system of example 22, wherein all magnets in at least one row of the first plurality of rows of magnets or the second plurality of rows of magnets is to comprise magnets with a same magnetic polarity. Example 28 may optionally include the system of example 22, wherein the display device is flexible, wherein the first plurality of rows of magnets and the second plurality of rows of magnets are to maintain proximity of the display device and the chassis as they are flexed. Example 29 may optionally include the system of example 22, wherein the display device is to comprise one or more of: a Thin Film Transistor (TFT) display device, an Organic Light-Emitting Diode (OLED) display device, and a Flexible OLED (FOLED) display device. Example 30 may optionally include the system of example 22, wherein the first surface of the display device is a back side of the display device that faces away from a second surface of the display device that is to display images. Example 31 may optionally include the system of example 22, wherein the first plurality of rows of magnets are parallel to each other. Example 32 may optionally include the system of example 22, wherein the first surface of the display device and the first surface of the chassis are to be coupled via a Ferro-fluid or oil.

Example 33 may optionally include an apparatus comprising means to perform a method as set forth in any preceding example.

In various embodiments, the operations discussed herein, e.g., with reference to FIGS. 1-8, may be implemented as hardware (e.g., logic circuitry), software, firmware, or combinations thereof, which may be provided as a computer program product, e.g., including a tangible (e.g., non-transitory) machine-readable or computer-readable medium having stored thereon instructions (or software procedures) used to program a computer to perform a process discussed herein. The machine-readable medium may include a storage device such as those discussed with respect to FIGS. 1-8.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
a first plurality of rows of magnets disposed on a first surface of a display device,
wherein a second plurality of rows of magnets, disposed on a first surface of a chassis, is to magnetically couple to the first plurality of rows of magnets, wherein an unfolded state of the display device and the chassis is to be maintained by alignment of magnetic force generated by the first plurality of rows of magnets and the second plurality of rows of magnets.

2. The apparatus of claim 1, wherein opposite magnetic poles from the first plurality of rows of magnets and the second plurality of rows of magnets are to be aligned to magnetically attract the display device and the chassis to each other.

3. The apparatus of claim 1, wherein one or more rows of the first plurality of rows of magnets is to comprise magnets with alternating magnetic polarity.

4. The apparatus of claim 1, wherein all magnets in at least one row of the first plurality of rows of magnets is to comprise magnets with a same magnetic polarity.

5. The apparatus of claim 4, wherein the display device is to be foldable at or near the at least one row of the first plurality of rows.

6. The apparatus of claim 1, wherein the display device is flexible, wherein the first plurality of rows of magnets and the second plurality of rows of magnets are to maintain proximity of the display device and the chassis as they are flexed.

7. The apparatus of claim 1, wherein the display device is to comprise one or more of: a Thin Film Transistor (TFT) display device, an Organic Light-Emitting Diode (OLED) display device, and a Flexible OLED (FOLED) display device.

8. The apparatus of claim 1, wherein the first surface of the display device is a back side of the display device that faces away from a second surface of the display device that is to display images.

9. The apparatus of claim 1, wherein the first plurality of rows of magnets are parallel to each other.

10. The apparatus of claim 1, wherein the first surface of the display device and the first surface of the chassis are to be coupled via a Ferro-fluid or oil.

11. An apparatus comprising:
a first plurality of rows of magnets disposed on a first surface of a chassis,
wherein a second plurality of rows of magnets, disposed on a first surface of a display device, is to magnetically couple to the first plurality of rows of magnets, wherein an unfolded state of the display device and the chassis is to be maintained by alignment of magnetic force generated by the first plurality of rows of magnets and the second plurality of rows of magnets.

12. The apparatus of claim 11, wherein opposite magnetic poles from the first plurality of rows of magnets and the second plurality of rows of magnets are to be aligned to magnetically attract the display device and the chassis to each other.

13. The apparatus of claim 11, wherein one or more rows of the first plurality of rows of magnets is to comprise magnets with alternating magnetic polarity.

14. The apparatus of claim 11, wherein all magnets in at least one row of the second plurality of rows of magnets is to comprise magnets with a same magnetic polarity.

15. The apparatus of claim 14, wherein the chassis is to be foldable at or near the at least one row of the first plurality of rows.

16. The apparatus of claim 11, wherein the display device is flexible, wherein the first plurality of rows of magnets and the second plurality of rows of magnets are to maintain proximity of the display device and the chassis as they are flexed.

17. The apparatus of claim 11, wherein the chassis is to comprise a computing device chassis, wherein the computing device chassis is to comprise one or more: a processor core, a graphics processing unit, memory, display driver circuitry, battery, wired or wireless communication device, a speaker, a microphone, one or more cameras, power supply, a power converter, solar cells, and one or more input buttons.

18. The apparatus of claim 17, wherein the solar cells are to be exposed on a second surface of the chassis that faces away from the first surface of the chassis.

19. The apparatus of claim 11, wherein a second surface of the chassis, which is on an opposite side of the chassis from the first surface of the chassis, is to operate as a heat sink for one or more heat generating components of the chassis.

20. The apparatus of claim 11, wherein the first plurality of rows of magnets are parallel to each other.

21. The apparatus of claim 11, wherein the first surface of the display device and the first surface of the chassis are to be coupled via a Ferro-fluid or oil.

22. A computing system comprising:
a chassis to house one or more processor cores, memory, a battery, a wireless communication device; and
a display device coupled to the chassis via a magnetic coupling to be established between a first plurality of magnets, disposed on a first surface of the display device, and a second plurality of magnets disposed on a first surface of the chassis, wherein an unfolded state of the display device and the chassis is to be maintained by alignment of magnetic force generated by the first plurality of rows of magnets and the second plurality of rows of magnets.

23. The system of claim 22, wherein at least one row of the first plurality of rows of magnets is to comprise magnets with a first magnetic polarity, wherein at least one row of the second plurality of rows of magnets is to comprise magnets with a second magnetic polarity, wherein the at least one row of the first plurality of rows of magnets and the at least one row of the second plurality of rows of magnets are to be aligned to provide a cogging row.

24. The system of claim 22, wherein the first plurality of magnets and the second plurality of magnets are to comprise N42 or N52 Neodymium magnets.

25. The system of claim 22, wherein one or more of the one or more processor cores, memory, and wireless communication device are to be located on a same integrated circuit device.

* * * * *